US006440876B1

(12) United States Patent
Wang et al.

(10) Patent No.: US 6,440,876 B1
(45) Date of Patent: Aug. 27, 2002

(54) LOW-K DIELECTRIC CONSTANT CVD PRECURSORS FORMED OF CYCLIC SILOXANES HAVING IN-RING SI—O—C, AND USES THEREOF

(75) Inventors: Qing Min Wang, Edison, NJ (US); Ce Ma, Apex, NC (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 09/971,837

(22) Filed: Oct. 5, 2001

Related U.S. Application Data

(60) Provisional application No. 60/239,332, filed on Oct. 10, 2000.

(51) Int. Cl.[7] .................. H01L 21/31; H01L 21/469
(52) U.S. Cl. .................. 438/778; 438/783; 438/789
(58) Field of Search .................. 438/789, 783, 438/778; 427/588

(56) References Cited

U.S. PATENT DOCUMENTS

| | | | |
|---|---|---|---|
| 4,539,418 A | | 9/1985 | Takago et al. |
| 4,599,440 A | | 7/1986 | Watanabe et al. |
| 5,290,736 A | | 3/1994 | Sato et al. |
| 5,324,539 A | * | 6/1994 | Maeda et al. ............ 427/248.1 |
| 5,412,055 A | | 5/1995 | Loo |
| 5,629,439 A | | 5/1997 | Bank et al. |
| 5,663,397 A | * | 9/1997 | Yamashita et al. .......... 549/214 |
| 5,780,661 A | | 7/1998 | Iwata et al. |
| 5,786,493 A | | 7/1998 | Rauleder et al. |
| 6,068,884 A | | 5/2000 | Rose et al. |

FOREIGN PATENT DOCUMENTS

JP  09136894 A  * 5/1997  ............. C07F/7/18

OTHER PUBLICATIONS

Misako Imachi, Jun Nakagawa and Michiro Hayashi, "Microwave Spectrum, Structure, Dipole Moment and Internal Rotation of Allylsilane," Journal of Molecular Structure, 102 (1983) 403–412.

Michio Niwano and Nobuo Miyamoto, "UV Light–Induced Decomposition and Polymerization of Organosilicon Compounds," Research Institute of Electrical Communication, Tohoku University, 2–1–1 Katahira, Aoba–ku, Sendai, Miyagi 980–3577, Review of Laser Engineering, vol. 26, No. 6; Jun. 1998; pp. 463–467.

Maurício F. Gozzi, M. Do Carmo Gonçalves, I. Valéria P. Yoshida, "Near–Stoichiometric Silicon Carbide From a Poly(Methylsilylene)/Tetra–Allylsilane Mixture," Journal of Materials Science 34 (1999) 155–159.

Sing–Pin Tay, J.P. Ellul, Susan B. Hewitt, N.G. Tarr, A.R. Boothroyd, "Evaluation of Silicon Carbide Formed with a Single Precursor of Di–tert–Butysilane," Materials Research Society Symposium Proceedings, vol. 242, pp. 525–530, 1992 Materials Research Society.

S. B. Hewitt, S.–P. Tay, and N. G. Tarr and A. R. Boothroyd, "Silicon Carbide Emitter Diodes by LPCVD (low–pressure chemical vapour deposition) Using di–tert–butylsilane," Can. J. Phys. vol. 70, 1992, pp. 946–948.

A.C. Dillon, M.B. Robinson, M.Y. Han and S.M. George, "Decomposition of Alkylsilanes on Silicon Surfaces Using Transmission FTIR Spectroscopy," Mat. Res. Soc. Symp. Proc. vol. 222, 1991, Materials Research Society, pp. 213–218.

R.A. Levy, J.M. Grow, Y. Yu, K.T. Shih, "Plasma Enhanced Chemical Vapor Depositon of Si–N–C–H Films from Environmentally Benign Organosilanes," Elsevier, Materials Letters 24 (1995) 47–52.

Roland A. Levy and James M.Grow, "LPCVD of Silicon Carbide Films from the Organosilanes Diethylsilane and Di–T–Butylsilane," Mat. Res. Soc. Symp. Proc. vol. 306, 1993 Materials Research Society, pp. 219–228.

Vladimir S. Mastryukov, Matthias Hofmann and Henry F. Schaefer III, "Structure and Conformations of Cyclopentasilane, $Si_5H_{10}$," J. Phys. Chem. A 1999, 103, pp. 5581–5584.

F. Höfler, G. Bauer and E. Hengge, "Schwingungsspektrum und Kraftkonstanten des Cyclopentasilans," Spectrochimica Acta., vol. 32A, pp. 1435–1441, Pergamon Press 1976.

Gábor Magyarfalvi, Peter Pulay, "Chemical Shift Anisotropies in Silicon Containing Three–Membered Rings. An Ab Intitio Study," Elsevier, Chemical Physics Letters 241 (1995) 393–398.

Michael C. Kwan and Karen K. Gleason, "Pyrolytic CVD of Poly(organosiloxane) Thin Films," Communications, Chemical Vapor Deposition 1997, 3, No. 6, pp. 299–301.

Ji–Mao Lin, Ai–Min Zhou, Hui Zhang and Ai–You Hao, "Synthesis of Dialkoxydimethylsilanes and 2,2 Dimethyl–1, 3–Dioxa–1–Silacyclo Compounds," Synthetic Communications, 27(14), 2527–2532, (1997).

Catrin Lorenz and Ulrich Schubert, "An Efficient Catalyst for the Conversion of Hydrosilanes to Alkoxysilanes," Chem. Ber. 1995, 128, 1267–1269.

* cited by examiner

*Primary Examiner*—Olik Chaudhuri
*Assistant Examiner*—Erik Kielin
(74) *Attorney, Agent, or Firm*—Philip H. Von Neida; Salvatore P. Pace

(57) ABSTRACT

Methods for depositing a low-k dielectric film on the surfaces of semiconductors and integrated circuits are disclosed. A Si—O—C-in-ring cyclic siloxane precursor compound is applied to the surface by chemical vapor deposition where it will react with the surface and form a film having a dielectric constant, k, less than 2.5. The compound generally has the formula ($—O—R_1—O—$)$SiR_2R_3$ or the formula ($—R_1—O—$)$SiR_2R_3$.

15 Claims, No Drawings

LOW-K DIELECTRIC CONSTANT CVD PRECURSORS FORMED OF CYCLIC SILOXANES HAVING IN-RING SI— O— C, AND USES THEREOF

This application claims priority from Provisional Patent Application Serial No. 60/239,332 filed Oct. 10, 2000.

FIELD OF THE INVENTION

The present invention provides for methods for forming a low-k dielectric thin film on semiconductors or integrated circuits using a Si—O—C-in-ring cyclic siloxane compound as a low-k dielectric CVD precursor.

BACKGROUND OF THE INVENTION

The increase in semiconductor design integration by feature size reduction has resulted in increased levels of interconnect and increased utilization of dielectric low-k thin films. The dielectric film is used as insulation around metal lines of a device and contributes to the RC time constant that controls the device speed. As the semiconductor industry has striven to reduce resistance (R) by the use of copper metallization, the push to the use of low-k dielectrics is to reduce capacitance (C). Reducing capacitance by lowering the dielectric constant k to the inter and intra level dielectric (ILD) film can improve device performance by reducing the RC time delay, decreasing the cross talk between adjacent metal lines and lowering the power dissipation.

Traditionally, the material of choice for the ILD is silicon dioxide ($SiO_2$) which can be prepared using silane, disilane or siloxane precursors in an oxidizing environment. The most popular deposition techniques for depositing ILD are chemical vapor deposition (CVD), low temperature plasma-enhanced CVD (PECVD), high density plasma CVD (HDPCVD). However, the dielectric constant of the posited $SiO_2$ is relatively high at 4.0.

As the semiconductor industry moves to thinner metal lines, ILD materials must have smaller dielectric constants. Industry publications have indicated that low-k materials with k values from 2.7 to 3.5 would be needed for 150 and 130 run technology nodes. When the industry moves to 100 nm technology node and below that in the future, extra low-k (ELK) materials having a k value from 2.2 to 2.6 and ultra low-k (ULK) materials with a k value less than 2.2 will be necessary.

The semiconductor industry has developed several low-k materials to replace silicon dioxide that are inorganic, organic or hybrid materials. These materials can be deposited by either chemical vapor deposition (CVD) or spin-on deposition (SOD) methods. The CVD technique utilizes traditional vacuum tools for depositing low-k films that include lower temperature plasma enhanced CVD (PECVD) and high density plasma CVD (HDPCVD). The SOD method uses spin coaters that have shown better extendibility to ELK or ULK by introducing pores in nanometer sizes. Low-k materials such as fluorinated silicate glass (FSG k~3.5–3.8), carbon or carbon fluorine based films and carbon-doped $SiO_2$ utilize CVD techniques. Other low-k materials, such as polyimide (k~2.9–3.5), hydrogen silsesquioxane (HSQ, k~2.7–3.0) and polyarylene ethers (k~2.6–2.8), can be deposited using SOD techniques.

As such, a number of technologies to provide lower dielectric constant CVD materials have been demonstrated in the 3.5 to 2.6 range. However, there are far fewer alternatives for k values at or below 2.5 for CVD materials in ELK/ULK applications. The present invention provides for new materials for use as extra low dielectric CVD precursors in extra low-k CVD materials for the semiconductor industry.

Given the desires of the semiconductor industry for lower k value materials, new low-k CVD materials are being sought. The present invention provides a novel class of compounds useful for forming a film on a semiconductor or integrated circuit by acting as a precursor for the film formed when the compound is applied.

SUMMARY OF THE INVENTION

The present invention provides for methods for fabricating a dielectric thin film on semiconductors and integrated circuits using a Si—O—C-in-ring cyclic siloxane compound. The dielectric film formed will be an organosilicon polymer film having low-k dielectric properties.

The Si—O—C-in-ring cyclic siloxane compounds are generally 1,3-dioxa-2-silacyclohydrocarbons and 1-oxa-2-silacyclohydrocarbons. One or more than one carbon atom in the hydrocarbon chain of above cyclic siloxane compounds can be substituted by one or more than one silicon atom.

The present invention also provides for methods for depositing a low-k dielectric film on a semiconductor or integrated circuit using a Si—O—C-in-ring cyclic siloxane compound.

The Si—O—C-in-ring cyclic siloxane compounds are precursors to the film formed. When these siloxane precursors are applied to the surface of a semiconductor or integrated circuit, they will react on the wafer surface forming a dielectric film. The ring opening polymerization of these cyclic compounds will form a dielectric film or layer that will have a k value between 2.0 and 2.5.

DETAILED DESCRIPTION OF THE PREFERRED EMBODIMENTS

The present invention provides for a method of fabricating a dielectric film on a semiconductor or integrated circuit wherein the dielectric film will be low-k comprising applying to the surface of the semiconductor or integrated circuit a Si—O—C-in-ring cyclic siloxane compound precursor.

The Si—O—C-in-ring cyclic siloxane compound is selected from the groups consisting of 1,3-dioxa-2-silacyclohydrocarbons and 1-oxa-2-silacyclohydrocarbons. The 1,3-dioxa-2-silacyclohydrocarbons generally have the formula (—O—$R_1$—O—)$SiR_2R_3$, wherein $R_1$ is saturated or unsaturated hydrocarbon with from 1 to 7 carbon atoms. $R_2$ and $R_3$ can be the same or different, and they are H, or methyl, or vinyl, or other hydrocarbons containing two or more than two carbon atoms. The 1-oxa-2-silacyclohydrocarbons generally have the formula (—$R_1$—O—)$SiR_2R_3$, where $R_1$ is saturated or unsaturated hydrocarbon with from 1 to 7 carbon atoms. $R_2$ and $R_3$ can be the same or different, and they are H, or methyl, or vinyl, or other hydrocarbons containing two or more than two carbon atoms.

One or more than one carbon atom in $R_1$ of above cyclic siloxane compounds can be substituted by one or more than one silicon atom.

Specific examples of these compounds include but are not limited to 2,2-dimethyl-1,3-dioxa-2-silacyclopentane, 2,2-dimethyl-1,3-dioxa-2-silacyclohexane, or 2,2,4,4,6-pentamethyl-1,3-dioxa-2-silacyclohexane,

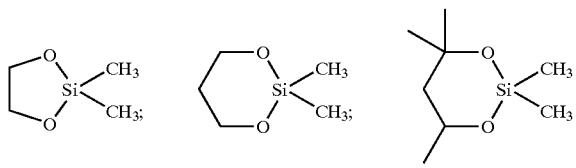

and 2-vinyl-2-methyl-1,3-dioxa-2-silacyclopentane, 2-vinyl-2-methyl-1,3-dioxa-2-silacyclohexane, or 2-vinyl-2,4,4,6-tetramethyl-1,3-dioxa-2-silacyclohexane,

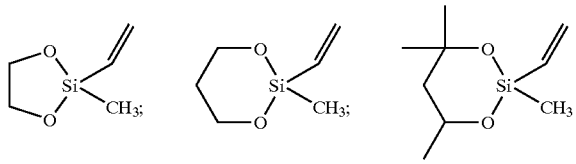

and 2,2-dimethyl-1-oxa-2-silacyclohexane, or its derivatives,

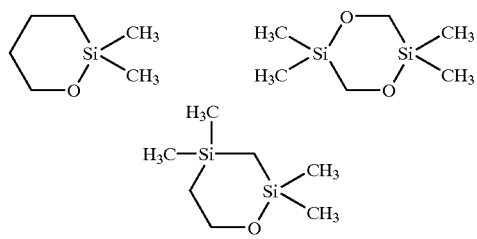

The films that are formed using the above-described Si—O—C-in-ring cyclic siloxane compounds will have dielectric constants, k, of below 2.5 in the range of about 2.0 to about 2.5.

The Si—O—C-in-ring cyclic siloxane compounds of the present invention can be prepared by conventional methods. For example, Lin et al. (*Syn. Comm.* 1997, 27(14), 2527–2532) demonstrates a synthesis method for 2,2-dimethyl-1,3-dioxa-1-silacycloalkane compounds. Schubert et al. (*Chem. Ber.* 1995, 128, 1267–1269) demonstrates a conversion of hydrosilanes to alkoxysilanes using an efficient catalyst system. Nedogrei et al. (*Zh. Prikl Khim*, 1988, 61(4), 937–940) demonstrates that transacetalization of a 1,3-dioxa-2-silacyclo compound with substituted diols in dioxane containing acid catalysts gave 16–75% of the corresponding dioxasilacycloalkanes. A modified synthesis method was also developed in this invention for preparing 1,3-dioxa-2-silacyclohydrocarbons. In this method, 1.0 equivalent of dimethyldimethoxysilane was mixed with 1.2 equivalents of a diol. To it, an acidic catalyst, TFA, was added. The optimal TFA concentration is $4 \times 10^{-5}$ M. The mixture was refluxed for 24 hours. After that, the stoichiometric amount of calcium hydride was added to neutralize the acid. The product was isolated by fractional distillation at atmospheric pressure. The yield was about 65–70%.

The low-k dielectric films formed by the compounds of the present invention are deposited using pyrolytic or plasma-assisted CVD processes. The siloxane precursor will react or polymerize on the surface of the wafer forming the dielectric layer. The reaction, in part, results in the opening of the cyclic structure and gives better control of organic content and the steric effect of the organic groups in the finished film. Reduction of film density and introduction of nano size pores help to achieve lower k values.

The present invention provides for low-k precursor chemistries and process methods of depositing low-k film using CVD techniques. The process system comprises a precursor delivery manifold system, a vacuum chamber as a plasma CVD reactor, a wafer substrate, and a computer control system.

The low-k precursor of this invention is injected into vacuum chamber with or without a carrier gas. Depending upon the physical properties of a member of the low-k precursor family, either liquid or vapor phase precursor is delivered by a manifold system to the vacuum chamber. The low-k precursor material is placed in a metallic source bubbler. Both pressure and temperature of the bubbler are controlled. For high vapor pressure precursors (>5 Torr at source temperature from 25° C. to 100° C.), a direct vapor delivery method based on a pressure mass flow controller can be employed. Typically, the downstream delivery line and a shower head in the vacuum chamber are heat traced to avoid any condensation. The precursor can be also delivered using a liquid injection method at room temperature. The liquid phase precursor or solution of solid phase precursor can be injected to a vaporizer where it is located at the vacuum chamber. The vaporizer converts liquid phase precursor into vapor phase precursor at the point-of-use. In either case, the precursor is delivered at a rate from 1 sccm to 1000 sccm by the manifold system. Most precursors in this invention are in a liquid state at room temperature. The vapor pressure curves in a temperature range from $-10°$ C. to 150° C. were obtained using an absolute technique that we have developed. Typically, the pure vapor of a precursor is delivered using an MKS pressure based mass flow controller at 60° C.

The low-k precursor family of this invention contains the necessary components for making low-k dielectric layers. These components are atoms of silicon, oxygen, carbon, and hydrogen. Therefore, the low-k precursors can be directly used in making the low-k films of the present invention. An additional oxygen containing precursor, such as $O_2$ or $N_2O$, is optional. The additional oxidant and optional inert carrier gases are delivered using thermal mass flow controllers.

The vacuum chamber is a chemical vapor deposition (CVD) reactor. One viable CVD reactor in which the methods of this invention are practiced is a parallel plate single wafer reactor. The process can be either pyrolytic or plasma-assisted CVD. The total pressure in the reactor is controlled from 0.01 mTorr to 100 Torr. RF power is applied to the upper electrode or the shower head. The RF power excites the precursor vapors that have been inputted into the vacuum chamber and generates reactive plasma. The frequency of RF is typically in the range of 1 kHz to 3 GHz. A frequency of 13.56 MHz is typical. The RF power can be varied from 1 to 1000 W. The preferred RF power is from 50 to 300 W. The RF power can be pulsed by alternating between on and off. When the duration of RF power on equals zero, the pyrolytic CVD condition is obtained.

A semiconductor substrate, typically a silicon wafer, is placed onto the bottom electrode. The size of the substrate can be up to 300 mm in diameter. The bottom electrode is heated by either electrical resistance heaters or by radiation heaters. The wafer temperature is controlled up to 600° C. The distance from the bottom electrode to the upper electrode can be also varied. Precursors deposited on the hot wafer surface will react and polymerize and this reaction and polymerization is driven by reactive species, thermal and ring strain energies. In this process, the opening and retention of the precursor ring structures of the present invention can be controlled within the low-k films.

A computer system controls the precursor delivery, RF powers, vacuum and pressure in the CVD chamber, as well as the temperature in the delivery manifold and in the reactor.

A low-k film with a thickness up to 10 microns can then be characterized for its thermal, mechanical, and electrical properties. A k value is obtained using aluminum dots MIS capacitance (C-V) measurements at 1 MHz.

EXAMPLES

General Synthesis Method for 1,3-Dioxa-2-silacyclohydrocarbons 1.0 Equivalent of dimethyldimethoxysilane was mixed with 1.2 equivalents of a diol. To it, an acidic catalyst, TFA, was added. The optimal TFA concentration is $4 \times 10^{-5}$ M. The mixture was heated at reflux for 24 hours. After that, the stoichiometric amount of calcium hydride was added to neutralize the acid. The product was isolated by fractional distillation at atmospheric pressure. The yields and the characterization data were listed below for selected compounds.

2,2-Dimethyl-1,3-dioxa-2-sila-cyclopentane (Compound 1)

Yield: 60%. APCI MS (m/z): 149.2 (100%, $C_4H_{10}SiO_2 \cdot CH_3OH$); $^1H$ NMR (200 MHz, $CDCl_3$, ppm): d=−0.1 (2 $CH_3$), d=3.2 (2 $CH_2$); $^{13}C$ NMR (50 MHz, $CDCl_3$, ppm): d=−5.8 (2 $CH_3$), d=49.1 (2 $CH_2$).

2,2-Dimethyl-1,3-dioxa-2-sila-cyclohexane (Compound 2)

Yield: 65%. $^1H$ NMR (200 MHz, Benzene-d6, ppm): d=0.1 (s, 6H, 2$CH_3$), 1.4 (m, 2H, $CH_2$), 3.8 (m, 4H, 2$CH_2$). $^{13}C$ NMR (50 MHz, Benzene-d6, ppm): d=−1 (Si—C) 32 ($CH_2$), 64 ($OCH_2$). Elemental analysis: calculated (%): C, 45.4, H, 9.2; found: C, 45.4, H, 9.1. APCI MS (with $CH_3OH$ as a mobile phase): calcd.: 132.1; found: 133.0 [M+H+, 100%], 221.0 [M+$CH_3O$+($CH_3$)$_2$Si, 58%], 165.0 [M+$CH_3OH$+H+, 43%], 252.7 [M+Si($CH_3$)$_3$+2$CH_3O$+H+, 24%], 265.0 [M+M+H+, 13%]. FT-IR (cm$^{-1}$): 1255.0 (m); 1143.8 (s); 1090.2 (vs); 973.7 (w); 930.9 (s); 846.2 (vs); 793.4 (vs); 745.6 (w); 711.7 (w).

2,2,4-Trimethyl-1,3-dioxa-2-sila-cyclohexane (Compound 3)

Yield: 67%. $^1H$ NMR (200 MHz, Benzene-d6, ppm): d=0.1 (s. 6H, 2$CH_3$), 1.2 (m, 2H, $CH_2$), 1.4–1.7 (m, 4H, $CH+CH_3$), 3.9–4.1 (m, 2H, $CH_2$). $^{13}C$ NMR (50 MHz, Benzene-d6, ppm): d=−0.5 (Si—$CH_3$), 25 (C—$CH_3$), 39 ($CH_2$), 63 (OCH), 70 ($OCH_2$). Elemental analysis: calcd. (%): C, 49.3, H, 9.6; found: C, 49.3, H, 9.7. APCI MS ($CH_3OH$ as a mobile phase): calculated: 146.1; found: 147.0 [M+H+, 100%], 178.9 [M+$CH_3OH$+H+, 50%], 221.0 [M+O—Si($CH_3$)$_2$, 67%], 293.1 [M+M+H+, 46%]. FT-IR (cm$^-$): 1378.6 (w); 1254.8 (m); 1157.6 (m); 1103.0 (s); 982.1 (m); 964.8 (s); 887.0 (s); 847.3 (s); 793.7 (s); 743.0 (w); 716.4 (w).

2,4,6-Tetramethyl-1,3-dioxa-2-sila-cyclohexane (Compound 4)

Yield: 63%. $^1H$ NMR (200 MHz, Benzene-d6, ppm): d=0.1 (m, 6H, 2$CH_3$), 1.1–1.5 (m, 8H, 2$CH_3$+$CH_2$), 3.9–4.2 (m, 2H, 2OCH). $^{13}C$ NMR (50 MHz, Benzene-d6, ppm): d=−0.2 (Si–$CH_3$), 24 ($CH_3$), 45 ($CH_2$), 68 (OCH). Elemental analysis: calcd. (%): C, 52.4, H, 10.1; found: C, 52.4, H, 10.1. APCI MS ($CH_3OH$ as a mobile phase): calculated: 160.1; found: 161.1 [M+H+, 100%], 195.0 [M+$CH_3OH$+H+, 78%], 280.9 [M+diol+$CH_3OH$+H+, 60%], 321.2 [M+M+H+, 10%]. FT-IR (cm$^{-1}$): 1377.1 (w); 1254.7 (m); 1167.9 (m); 1152.8 (m); 1117.6 (s); 978.2 (vs); 911.6 (m); 886.9 (w); 871.6 (w); 839.0 (s); 793.1 (vs).

2,2,4,4,6-Pentamethyl-1,3-dioxa-2-sila-cyclohexane (Compound 5)

Yield: 66%. $^1H$ NMR (200 MHz, Benzene-d6, ppm): d=0.2 (s, 6H, 2$CH_3$), 1.1–1.6 (m, 11H, 3$CH_3$+$CH_2$), 4.2 (m, 1H, CH). $^{13}C$ NMR (50 MHz, Benzene-d6, ppm): d=0.1 (Si—$CH_3$), 0.2 (Si—$CH_3$), 25 ($CH_3$), 28 ($CH_3$), 34 ($CH_3$), 50 ($CH_2$), 66 (OCH), 73 (OC). Elemental analysis: calcd. (%): C, 55.1, H, 10.4; found: C, 55.7, H, 10.4. APCI MS ($CH_3OH$ as mobile phase): calcd.: 174.1; found: 174.9 [M+H+, 9%], 192.9 [M+$H_2O$+H+, 32%], 266.9 [M+Si($CH_3$)$_2$ O+$H_2O$+H+, 53%], 367.0 [M+M+$H_2O$+H+, 100%]. FT-IR (cm$^{-1}$): 1366.3 (w); 1254.9 (m); 1200.0 (w); 1164.3 (m); 1129.9 (w); 1092.1 (w); 1054.8 (m); 1002.4 (s); 979.5 (s); 955.4 (m); 908.4 (m); 873.9 (s); 852.3 (m); 837.8 (m); 791.1 (vs); 653.6 (m).

2,4,4,6,6-Hexamethyl-1,3-dioxa-2-sila-cyclohexane (Compound 6)

Yield: 82%. $^1H$ NMR (200 MHz, Benzene-d6, ppm): d=0.2 (s, 6H, 2$CH_3$), 1.2 (s, 2H, 4$CH_3$ a), 1.3 (s, 10H, 4$CH_3$ e), 1.6 (s, 2H, $CH_2$). $^{13}C$ NMR (50 MHz, Benzene-d6, ppm): Elemental analysis: calculated (%): C, 57.4, H, 10.7; found: C, H, APCI MS ($CH_3OH$ as mobile phase): calcd.: 188.1; found: 190.0 [M+2H+, 5%], 223.0 [M+$CH_3OH$+H+, 40%], 265.0 [M+($CH_3$)$_2$Si+$H_2O$+H+, 100%], 369.0 [M+Si($CH_3$)$_2$ O+SiO$CH_3$+$H_2O$, 68%]. FT-IR (cm$^{-1}$): 1451.9 (vw); 1365.8 (w); 1255.8, (m); 1197.9 (s); 1025.7 (vs); 958.0 (m); 868.9 (s); 790.5 (vs); 690.0 (w); 659.3 (m).

2-Vinyl-2,4,4,6-tetramethyl-1,3-dioxa-2-sila-cyclohexane (Compound 7)

Yield: 70%. $^1H$ NMR (200 MHz, Benzene-d6, ppm): δ=0.2 (s, 3H, $CH_3$), 1.4 (m, 11H, 3$CH_3$, $CH_2$), 4.2 (m, 1H, CH), 6.0 (3H, (3H, $CH_3$), $^{13}C$ NMR (50 MHz, Benzene-d6, ppm): δ=−0.1 (Si—$CH_3$), 25 ($CH_3$), 28 ($CH_3$), 33 ($CH_3$), 50 ($CH_2$), 66 (OC), 73 (OCH), 134 (Si—$C_2H_3$), 137 (Si—$C_2H_3$). Elemental analysis: calculated (%): C, 58.0, H, 9.7; found: C, 57.8, H, 10.1. APCI MS ($CH_3OH$ as mobile phase): calcd.: 186.3; found: 187.3 (M+H+, 100%), 219 (M+$CH_3$). FT-IR (cm$^{-1}$): 1366.9 (m); 1255.3, (m); 1200.8 (m); 1163.2 (s); 1129.3 (m); 1091.6 (m); 1054.5 (s); 1001.1 (s); 979.6 (vs); 954.9 (s); 908.3 (m); 817.9 (m); 836.3 (m); 789.8 (s); 759.6 (s); 715.9 (w).

2-Vinyl-2-methyl-1,3-dioxa-2-sila-cyclohexane (Compound 8)

Yield: 78%. $^1H$ NMR (200 MHz, Benzene-d6, ppm): δ=0.2 (s, 3H, $CH_3$), 1.3 (m, 1H, $CH_2$, a), 1.6 (m, 1H, $CH_2$, e), 3.9 (m, 4H, 2$CH_2$), 6.0 (m, 3H, $C_2H_3$); $^{13}C$ NMR (50 MHz, Benzene-d6, ppm): δ=−2.0 (Si—$CH_3$), 32.5 ($CH_2$), 64.9 (2O$CH_2$), 135.0 ($C_2H_3$). Elemental analysis: calculated (%): C, 49.96, H, 8.39; found: C, 49.87, H, 8.83. APCI MS ($CH_3OH$ as mobile phase): calcd.: 144.2; found: 145.2 (M+H+, 100%). FT-IR (cm$^{-1}$): 1257.3 (m); 1142.7(s); 1089.2 (vs); 972.3 (m); 929.6(s); 857.2 (s); 811.5 (s); 771.8 (s); 708.2 (m).

Low-k Film with 2,2-Dimethyl-1,3-dioxa-2-sila-cyclohexane (Compound 2) without any Oxidants Precursor source temperature 50° C., delivery temperature 60° C., source flow rate 4 sccm, wafer temperature 30° C., argon purge flow rate 56 sccm, RF power 100 W, chamber pressure 300 mTorr, film refractive index is between 1.43 and 1.45 by a prism coupler, film dielectric constant of aluminum dot capacitors is 2.13 at 1 MHz.

Low-k Film with 2,2-Dimethyl-1,3-dioxa-2-sila-cyclohexane (Compound 2) with Oxygen Precursor source temperature 50° C., delivery temperature 60° C., source flow rate 4 sccm, wafer temperature 30° C., oxygen flow rate 29 sccm, argon purge flow rate 56 sccm, RF power 100 W, chamber pressure 300 mTorr, film refractive index is between 1.43 and 1.45 by a prism coupler, film dielectric constant of aluminum dot capacitors is 2.52 at 1 MHz.

To deposit the low-k film, either pyrolytic or plasma enhanced CVD can be used. Film dielectric constants as low as 2.0 can be achieved using a single precursor of this invention without an oxidant precursor. Because of high vapor pressures of the precursors in this invention, we deliver vapor directly to the CVD reactor. The delivery flow rate is from 1 sccm to 50 sccm. The wafer temperature is below 200° C. The film dielectric constant is between 2.0 to 2.5.

While this invention has been described with respect to particular embodiments thereof, it is apparent that numerous other forms and modifications of this invention will be obvious to those skilled in the art. The appended claims and this invention generally should be construed to cover all such obvious forms and modifications which are within the true spirit and scope of the present invention.

Having thus described the invention, what we claim is:

1. A method for fabricating a dielectric film having low-k values on a semiconductor or integrated circuit surface comprising applying to said surface a Si—O—C-in-ring cyclic siloxane precursor wherein said precursor reacts with and deposits on said surface thereby forming said dielectric film.

2. The method as claimed in claim 1 wherein said Si—O—C-in-ring cyclic siloxane compound is selected from the group consisting of 1,3-dioxa-2-silacyclohydrocarbons and 1-oxa-2-silacyclohydrocarbons.

3. The method as claimed in claim 2 wherein said 1,3-dioxa-2-silacyclohydrocarbons have the formula (—O—$R_1$—O—)$SiR_2R_3$ wherein $R_1$ is saturated or unsaturated hydrocarbon with from 1 to 7 carbon atoms, $R_2$ and $R_3$ are the same or different, and are selected from the group consisting of H, methyl, vinyl, or other hydrocarbons containing two or more carbon atoms.

4. The method as claimed in claim 3 wherein said 1,3-dioxa-2-silacyclohydrocarbon is 1,3-dioxa-2-sila-2,2-dimethyl-cyclopentane.

5. The method as claimed in claim 2 wherein said 1-oxa-2-silacyclohydrocarbons have the formula (—$R_1$—O—)$SiR_2R_3$, where $R_1$ is saturated or unsaturated hydrocarbon with from 1 to 7 carbon atoms, one or more than one carbon atom in $R_1$ can be substituted by a silicon atom, $R_2$ and $R_3$ are the same or different, and are selected from the group consisting of H, methyl, vinyl, or other hydrocarbons containing two or more carbon atoms.

6. The method as claimed in claim 5 wherein in said formula $R_1$ is saturated or unsaturated hydrocarbon with from 1 to 7 carbon atoms, and one or more than one carbon atom in $R_1$ can be substituted by one or more than one silicon atom.

7. The method as claimed in claim 5 wherein said 1-oxa-2-silacyclohydrocarbon is 2,2-dimethyl-1-oxa-2-sila-oxacyclohexane.

8. The method as claimed in claim 1 wherein said dielectric film has a k value below 2.5.

9. The method as claimed in claim 8 wherein said dielectric film has a k value in the range of about 2.0 to about 2.5.

10. The method as claimed in claim 1 wherein said Si—O—C-in-ring cyclic siloxane precursor is deposited on the surface of the semiconductor or integrated circuit using chemical vapor deposition.

11. The method as claimed in claim 10 wherein said chemical vapor deposition is pyrolytic or plasma-assisted.

12. The method as claimed in claim 10 wherein said precursor is in either the vapor phase or the liquid phase prior to deposition.

13. The method as claimed in claim 10 wherein said precursor is a single precursor, thereby not requiring an additional oxidant compound.

14. The method as claimed in claim 1 further comprising applying said precursor with an additional oxidant compound.

15. The method as claimed in claim 1 wherein the ratio of opening and retention of the precursor ring structure on said surface can be adjusted during chemical vapor deposition.

* * * * *